Sept. 12, 1967 T. H. RAMSEY, JR 3,341,743

INTEGRATED CIRCUITRY HAVING DISCRETE REGIONS OF SEMICONDUCTOR MATERIAL ISOLATED BY AN INSULATING MATERIAL

Filed Oct. 21, 1965 3 Sheets-Sheet 1

INVENTOR

Thomas H. Ramsey, Jr.

BY William E. Johnson Jr.

ATTORNEY

Sept. 12, 1967 T. H. RAMSEY, JR 3,341,743

INTEGRATED CIRCUITRY HAVING DISCRETE REGIONS OF SEMICONDUCTOR MATERIAL ISOLATED BY AN INSULATING MATERIAL

Filed Oct. 21, 1965

3 Sheets-Sheet 2

INVENTOR
Thomas H. Ramsey, Jr.

BY William E. Johnson Jr.

ATTORNEY

INVENTOR
Thomas H. Ramsey, Jr.

BY William E. Johnson, Jr.

ATTORNEY

United States Patent Office 3,341,743
Patented Sept. 12, 1967

3,341,743

INTEGRATED CIRCUITRY HAVING DISCRETE REGIONS OF SEMICONDUCTOR MATERIAL ISOLATED BY AN INSULATING MATERIAL

Thomas H. Ramsey, Jr., Garland, Tex., assignor to Texas Instruments Incorporated, Dallas, Tex., a corporation of Delaware Filed Oct. 21, 1965, Ser. No. 499,529
5 Claims. (Cl. 317—101)

Figure 1:
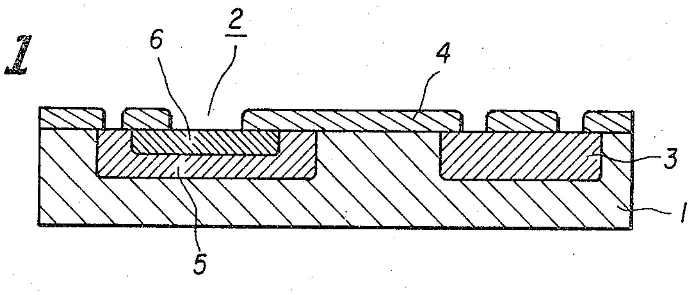
Figure 2:
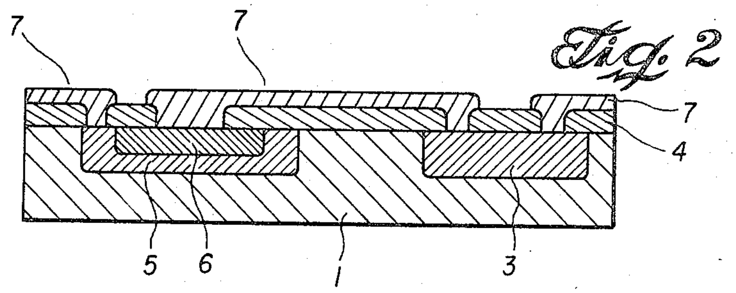
Figure 3:
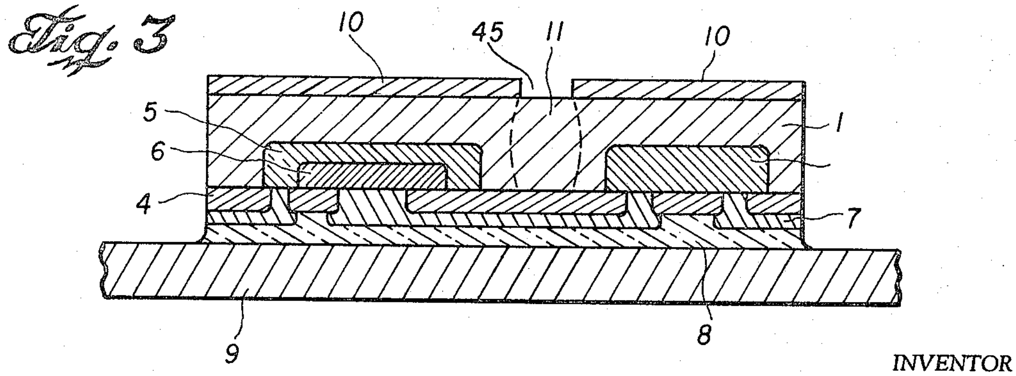

The present invention relates to integrated circuits of the kind in which the components thereof are electrically isolated from one another, and more particularly to an improved integrated circuit in which the components are isolated from one another by a novel composition of matter.

Although the desirability and practicability of integrated circuits are well recognized, the problems of providing requisite isolation between separate circuit components in a single, physical unit and desired electrical connections between individual portions thereof pose serious obstacles to the attainment of the truly generic approach thereto. While various electronic circuits are relatively well suited for incorporation in a single, solid-state unit, other electronic circuits require such a high degree of electrical isolation between components thereof that conventional solid-state processing is inapplicable to produce solid-state circuits therefrom.

The present invention provides for the establishment in a single, solid-state unit of a plurality of electronic components in accordance with known transistor manufacturing procedures, followed by the establishment of requisite electrical connections to such electronic components, and between individual portions thereof as required for attainment of a desired circuit configuration. This is accomplished with the circuit components relatively unisolated in the crystal wafer. The invention then provides for the establishment of electrical isolation (or insulation) between the circuit components without disturbing the components themselves or the electrical connections therebetween. It is possible to carry out the process of the present invention with conventional semiconductor processing equipment and without modification of recognized processing techniques, so that the process hereof is admirably suited for utilization with existing manufacturing facilities. There is provided herein, however, the material advantage of attaining an improved electrical isolation between components of a solid-state circuit.

It is therefore an object of the invention to provide an improved integrated circuit device; it is a further object to provide an integrated circuit in which at least some of the components of the circuit are isolated from one another by an isolation medium. It is another object of the invention to provide an integrated circuit device which uses a sodium silicate composition as an isolation medium.

The invention, in brief, comprises the fabrication of an integrated circuit in a monolithic semiconductor slice, the selective etching from the backside of the slice to form an air gap between the components of the circuit to be isolated, and backfilling the air gap with an isolation medium, for example, a sodium silicate composition. One embodiment of the invention comprises the formation of a thin glass film on the backside of the selectively etched wafer prior to the back-filling with the isolation medium.

Figure 7:
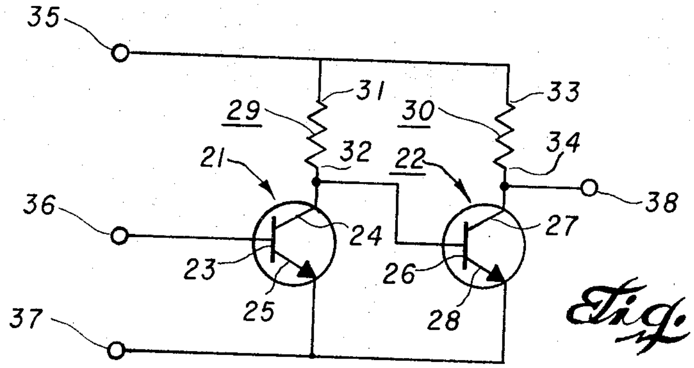

The novel features believed to be characteristic of the invention are set forth in the appended claims. The invention itself, however, as well as further objects and advantages thereof, will best be understood from the following detailed description of illustrative embodiments, when read in conjunction with the accompanying drawing wherein:

FIGURES 1–6 illustrate the improved integrated circuit complex of the invention at various stages of manufacture;

FIGURE 7 schematically illustrates a simple circuit; and

Figure 8:
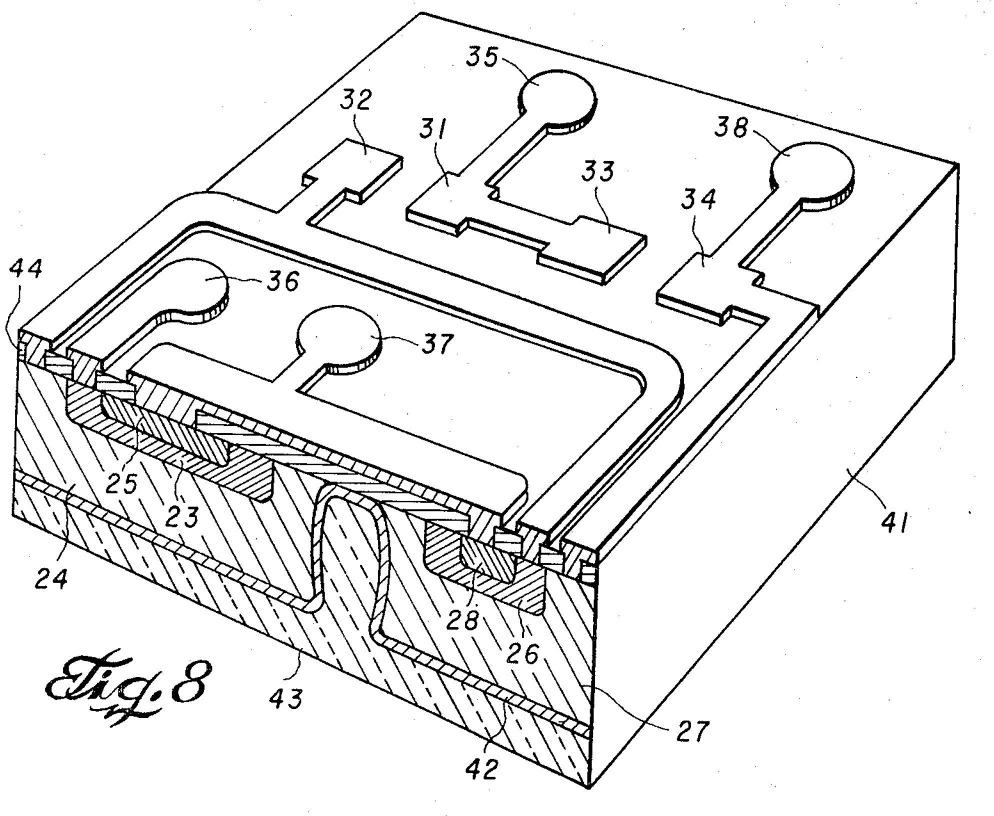

FIGURE 8 illustrates a pictorial view in section of an integrated circuit formed according to the invention which embodies the circuit of FIGURE 7.

Considering first the process and referring to FIGURES 1 to 6 of the drawings, the manufacture of the improved integrated circuit includes the initial preparation of a wafer of monocrystalline semiconducting material of requisite polarity, in accordance with established procedures. Although a substantial number of circuit complexes may be formed from a single wafer of semiconducting material, the following description appertains to a single complex in the interests of simplicity. The individual semiconducting devices forming the components of the circuit complex hereof may be formed, for example, by diffusion of selected impurities into the wafer and through suitable and known control of these diffusion steps it is possible to produce in a single wafer a large plurality of semiconducting devices such as diodes and transistors. The foregoing may follow conventional manufacturing techniques, wherein it is normal to produce a large number of semiconducting devices in a single wafer, and later to separate these into individual circuit components. FIGURE 1 illustrates the device or circuit unit in an early stage in the manufacture of the integrated circuit of this invention, wherein a wafer 1 is shown with a transistor 2 and a resistor 3 formed therein. The transistor 2 may be formed by the controlled diffusion of a selected impurity into the front face of the wafer to form a base layer 5, and the subsequent limited diffusion of an impurity of opposite polarity into this base layer to form an emitter layer or dot 6. The wafer itself has a suitable impurity disposed therethrough to impart the desired polarity to the material so that there is provided in the transistor 2 a pair of rectifying junctions disposed in conventional manner between the separate portions of the transistor. Similarly, the resistor 3 may be formed by the diffusion of an impurity into the wafer. Subsequent to the diffusion of selected impurities into the wafer there are formed openings through the protective coating 4 for example, silicon oxide, atop the wafer for communication with separate portions of the transistor and resistor in order to afford communication thereto for electrical connections. These openings, as shown in FIGURE 1, may be produced by suitable controlled etching operations.

Attachment of electrical connections to the circuit elements of the solid-state unit is preferably accomplished by the plating of a suitable metal upon the upper surface of the unit, such that this metal then extends through the openings in the coating 4 about the wafer. There will thus be seen in FIGURE 2 to be formed in the above manner electrical connections 7 extending over the surface of the protective coating 4 and through the openings therein into electrical ohmic contact with selected regions of the transistor 2 and resistor 3 diffused into the wafer. In this respect, it is particularly to be noted that the coating 4 must have a high electrical resistance in order to properly isolate the electrical leads 7 from remaining portions of the circuit. All of the steps of the process described up to this point may be performed without moving the wafer from which the semiconducting solid-state circuit is to be formed.

Following the application of the electrical connections over the upper surface of the wafer and into electrical contact with selected portions of the transistor and resistor formed therein, the wafer is inverted and mounted face down to a ceramic or glass base 9, using a hold-down plastic medium 8. This inversion leaves a back face of the wafer exposed. There is then formed on said back face a protective coating 10, for example, silicon oxide. This back face is then operated upon in a conventional manner, such as by etching, to form an opening 45 through the protective coating 10 on the wafer. The opening 45 is oriented to lie in line with the space between the devices 2 and 3 formed in the wafer. Through this opening 45 there is applied a selective etchant, such as CP8, described in "Transistor Technology," vol. 2, edited by F. J. Biondi, at page 598, which operates to relatively rapidly etch through the wafer from the back side thereof to the front. In this respect, it is noted that any of the class of etchants which are rich in nitric acid are selective, CP8 being formed of five parts of concentrated nitric acid and three parts of concentrated hydrofluoric acid. With regard to the selectivity of the etching operation, it is contemplated in accordance herewith that there shall be etched out a moat or channel extending through the wafer brom the back thereof to the front, but not through the protective coating 4 upon the front of the wafer. In accordance herewith, the protective coating 4 upon the front face of the wafer whereat the transistor 2 and resistor 3 are diffused is maintained intact throughout the process hereof. Likewise, the electrical connections 7 plated upon this front face of the wafer over the protective coating 4 and into electrical connection with different regions within the wafer, are maintained inasmuch as the etching operation does not extend beyond the front face of the wafer from the back thereof. The etchant is applied to the back of the wafer which is uppermost following the above-noted inversion of same, and there is consequently etched away the channel 11′, indicated by dashed line region 11, extending through the wafer from the back thereof to the under side of the protective coating upon the front face of the wafer. It will be appreciated that following this etching step the wafer is divided into separate parts, insofar as the semiconducting material is concerned, but the wafer can easily be handled because the separated parts are mounted down on the ceramic base 9, using the hold-down plastic medium 8.

Figure 4:
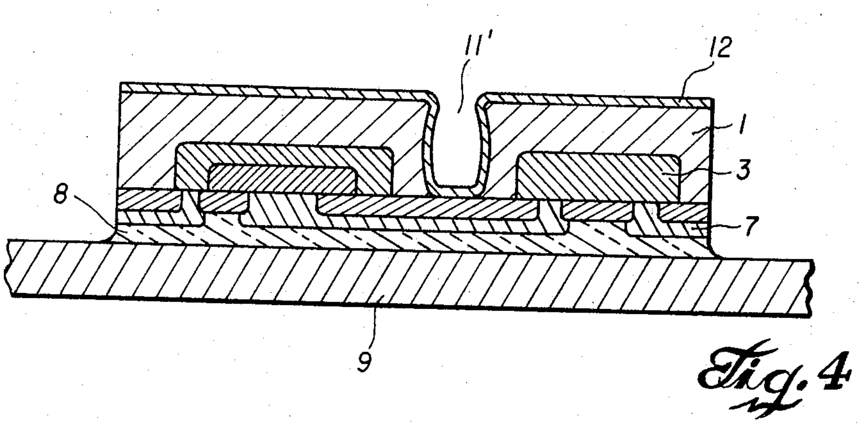
Figure 5:
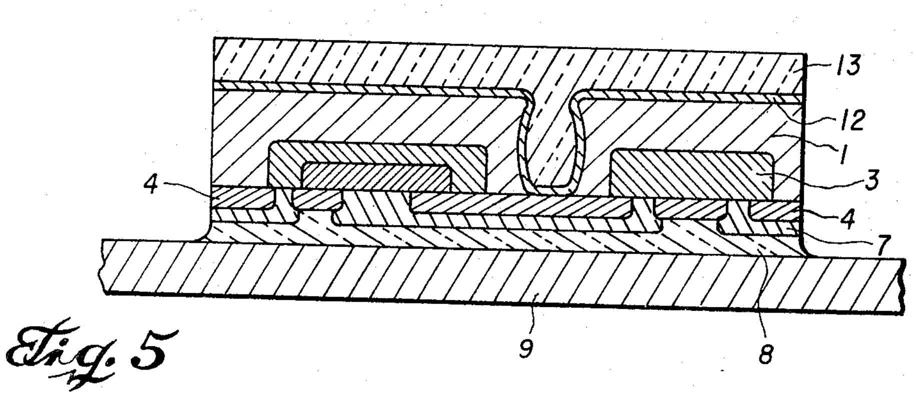
Figure 6:
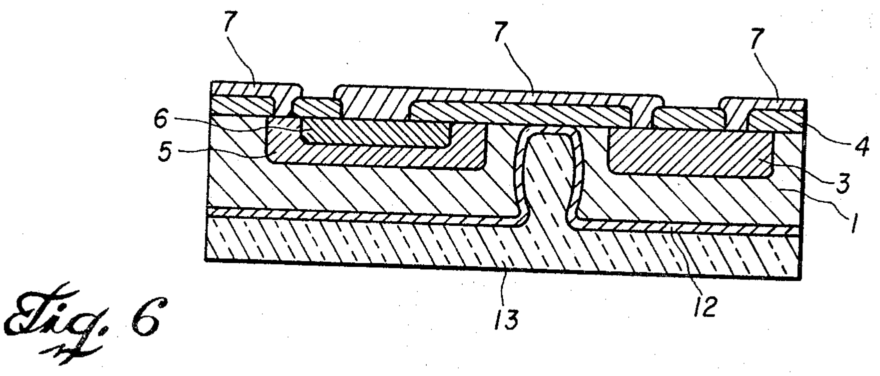

Following the above-described etching of the moat 11′ through the wafer, a thin glass film 12, approximately 2100 A. thick, is applied to the back side of the wafer, as illustrated in FIGURE 4. The film is preferably a borosilicate glaze, and can be applied in a conventional evaporation manner to provide a buffer zone between the semiconductor wafer 1 and the subsequently applied insulating material 13.

There is a current trend to consider sodium (Na) as a major factor in degradation of semiconductor devices, and because of this trend the glass film 12 can be used as a buffer zone, if desired, to prevent migration of the sodium into the semiconductor material. This insulating material 13, preferably in a liquid form, is applied over the buffer zone 12 to fill the moat 11′. This insulating material serves a plurality of purposes and may, for example, comprise a sodium silicate ($Na_2O \cdot SiO_2$). Since sodium silicates are found to vary considerably between commercial vendors, care should be given to the selection of the material. One such sodium silicate which has been found to be particularly effective is Number 31, available from Sauereisen Cements Company in Pittsburgh, Pennsylvania. A preparation of $Al_2O_3$ and $SiO_2$ (in quartz form) is mixed, wherein the ratio is about 1 part $Al_2O_3$ and 3 parts $SiO_2$. The $Al_2O_3$ is itself a one to one (1:1) mixture of large mesh (−100) and small mesh (−325), the small mesh being used with the large mesh to reduce the porosity of the mixture. The final insulating medium 13, in the preferred embodiment, comprises about 25% of the sodium silicate and about 75% of the $Al_2O_3$—$SiO_2$ mixture. With the filling of the moat 11′ with a material such as above described, there is provided a substantial electrical insulation, or isolation, between the separate portions of the wafer 1 and, in particular, between the transistor 2 and resistor 3 formed therein. Furthermore, the insulating material used for the back fill and identified by the numeral 13 serves to rigidly bond together the various portions of the wafer by refilling the moat 11′. With the hardening of the liquid 13, poured into the moat 11′, it will be appreciated that the wafer is again joined together into a single integral unit. Not only are the separate portions of the wafer electrically isolated by the interposed insulation but, furthermore the structural rigidity of the wafer is restored. It is to be appreciated that the insulating material 13 has substantially the same coefficient of expansion as the semiconductor.

Following the foregoing steps, the unit is further processed in accordance with relatively conventional manufacturing steps, and suitable encapsulation is performed.

There has been described above the preferred and improved steps of the process of this invention, wherein there is formed a solid-state circuit for semiconducting material to produce a maximized insulation between separate components of the circuit while yet attaining a truly unitary solid-state device formed of a number of components. Although the process has been described in simplified form as related to a small wafer it will be appreciated that the process is equally applicable to more complicated configurations wherein a larger number of semiconducting devices and circuit elements are to be isolated within a single unit. By the utilization of selective etching, suitably controlled and applied from the back side of the wafer, it will be seen that the unit is at all times maintained in one single piece, and under no circumstances are the separate electronic components thereof physically separated. This is highly advantageous in that very serious difficulties arise from efforts to recombine separate solid-state devices into a single unit. The problems of applying electrical connections to the unit in extension between portions of separate devices therein are minimized. Thus, the application of the electrical leads 7 is materially simplified, inasmuch as the same are applied immediately following the formation of the separate transistors or diodes within the unit. It is not necessary to employ a multiplicity of operations wherein the unit or wafer is moved from a single spot, thereby precluding prior-art difficulties of alignment or registration arising from attempts to place the wafer or unit back into exact original positions for performing further operations thereon. Inasmuch as the physical dimensions of the individual components of the solid-state circuit hereof are extremely minute, as of the order of some few mils or thousandths of an inch, it will be appreciated that the application of electrical connections to same becomes extremely difficult unless exact registration between the manufacturing apparatus and the unit or wafer itself is maintained.

It will be seen from the illustration of FIGURE 8 (which embodies the circuit of FIGURE 7 and like numbers denote like components) that the pair of transistors are completely isolated from each other by the barrier of insulating material 43 with the sole interconnection of transistor elements being provided by electrical leads, as identified above, extending across the insulating coating upon the upper surface of the solid-state unit. Likewise, the resistors 29 and 30 of the circuit of FIGURE 7 are included as an integral part of the single physical unit, but are not visible in FIGURE 8 because of being beneath the surface of the device.

The unitary integrated circuit of the present invention will be seen to comprise a single integral element embodying semiconducting material of desired properties in particular relationships, together with a bonded insulating material which affords the necessary electrical insulation between elements, as well as a highly desirable structural strength and rigidity to the resultant unit. The present invention provides a highly practical manner of producing an integrated circuit having the attributes sought after in the art. Accordingly, the difficulties of multiple handling, as well as registry of minute elements with manufacturing equipment, is minimized, so as to thereby attain extreme accuracy at a reduced cost. This results not only in an improved result, but also in a minimization of the failures during processing, so as to thereby even further commend the process hereof to commercial manufacture.

While the circuit device of FIGURE 8 has been illustrated as embodying the invention, such a circuit (as in FIGURE 7) forms no part of the invention and is in no sense to be construed as a limiting factor, but is merely shown and described to illustrate one of a large number of circuits which could be embodied in an integrated circuit device fabricated according to the invention. Although the invention has been described in a simplified form with respect to a small wafer that involves only the isolation of a few elements, it will be appreciated that the invention is equally applicable to more complicated configurations wherein a larger number of elements are to be isolated within a unit.

What is claimed is:

1. An improved integrated semiconductor circuit comprising:
(a) a body having a plurality of separate regions of semiconductor material, said regions having semiconductor devices formed therein, each region having a face on one surface of said body;
(b) an integral insulating coating upon said one surface of said body, said coating having openings exposing selected portions of said devices for electrical connections;
(c) an integral insulation medium, part of which comprises sodium silicate, between said separate regions of semiconductor material to thereby electrically isolate said regions from each other, said insulation medium being bonded to said semiconductor regions; and
(d) connecting means on said coating electrically connecting said separated semiconductor devices together to form a circuit.

2. The integrated circuit according to claim 1 wherein said isolation medium comprises the following approximate proportions:
(a) 25% of $Na_2O \cdot SiO_2$; and
(b) 75% of a mixture of about 3 parts $SiO_2$ and 1 part $Al_2O_3$.

3. The integrated circuit according to claim 2 wherein said $Al_2O_3$ comprises at least two mesh sizes of particles.

4. An improved integrated circuit device comprising:
(a) a body having a plurality of zones of semiconductor material separated from each other by a composition, at least a part of which is sodium silicate, which extends completely through the body in bonded contact with said zones;
(b) circuit components in said zones;
(c) a protective insulating coating over said body; and
(d) electrical connections overlying said coating and extending through said coating into selective contact with said circuit components in different ones of said zones, thereby electrically connecting same together to form said integrated circuit.

5. An improved integrated semiconductor circuit comprising:
(a) a body having a plurality of separate regions of semiconductor material, said regions having semiconductor devices formed therein, each region having a face on one surface of said body;
(b) an integral insulating coating upon said one surface of said body, said coating having openings exposing selected portions of said devices for electrical connections;
(c) a glass film covering at least a portion of said separate regions of semiconductor material;
(d) an integral insulation medium, at least a portion of which is sodium silicate, between said separate regions of semiconductor material to thereby electrically isolate said regions from each other, said insulation medium being bonded to said glass film; and
(e) connecting means on said coating electrically connecting said separated semiconductor device together to form a circuit.

References Cited

UNITED STATES PATENTS 3,247,428 4/1966 Perri et al.
3,290,753 12/1966 Chang.

ROBERT K. SCHAEFER, *Primary Examiner.*

J. R. SCOTT, *Assistant Examiner.*